United States Patent
Hester

(10) Patent No.: US 7,889,001 B2
(45) Date of Patent: Feb. 15, 2011

(54) SYSTEMS AND METHODS OF REDUCED DISTORTION IN A CLASS D AMPLIFIER

(75) Inventor: Richard Knight Hester, McKinney, TX (US)

(73) Assignee: Texas Instruments Incorporated, Dallas, TX (US)

(*) Notice: Subject to any disclaimer, the term of this patent is extended or adjusted under 35 U.S.C. 154(b) by 0 days.

(21) Appl. No.: 12/503,820

(22) Filed: Jul. 15, 2009

(65) Prior Publication Data

US 2011/0012676 A1    Jan. 20, 2011

(51) Int. Cl.
    *H03F 21/00*     (2006.01)
(52) U.S. Cl. .................................. 330/207 A; 330/251
(58) Field of Classification Search ................. 330/251, 330/207 A, 10
See application file for complete search history.

(56) References Cited

U.S. PATENT DOCUMENTS

| | | | | |
|---|---|---|---|---|
| 7,315,202 B2* | 1/2008 | Tsuji | ........................... | 330/10 |
| 7,355,473 B2* | 4/2008 | Wu | ............................. | 330/10 |
| 7,463,089 B1* | 12/2008 | Bapat et al. | .................. | 330/10 |
| 2002/0000878 A1* | 1/2002 | Berkhout | ..................... | 330/10 |
| 2007/0146069 A1* | 6/2007 | Wu et al. | .................... | 330/251 |
| 2010/0109768 A1* | 5/2010 | Kotowski et al. | ............. | 330/10 |

\* cited by examiner

*Primary Examiner*—Henry K Choe
(74) *Attorney, Agent, or Firm*—John J. Patti; Wade J. Brady, III; Frederick J. Telecky, Jr.

(57) ABSTRACT

Systems and methods for reduced distortion in a class D amplifier are provided. An "ideal" digital output signal is produced. The "ideal" digital output signal is then compared to the actual output signal in an error amplifier. The integrator input is the difference between the output stage waveform and the ideal output stage waveform. The net input to the integrator now comprises the imperfections of the power stage, and the feedback loop drives their average to zero. This error is then amplified and integrated. The integrated signal is than applied to a summer where it is added to the analog input. Then as in the typical Class D amplifier, the integrated signal is compared in an error amplifier to a ramp signal generated from the ramp generator.

19 Claims, 8 Drawing Sheets

US 7,889,001 B2

1

SYSTEMS AND METHODS OF REDUCED DISTORTION IN A CLASS D AMPLIFIER

TECHNICAL FIELD

The present disclosure is generally related to electronics and, more particularly, is related to switching amplifiers.

BACKGROUND

A class-D amplifier or switching amplifier is an electronic amplifier which, in contrast to an active resistance used in linear mode AB-class amplifiers, uses the switching mode of transistors to regulate power delivery. The amplifier, therefore, features high power efficiency (low energy losses), which additionally results in lower weight by eliminating the bulky heat sinks. Additionally, if voltage conversion is necessary, a higher switching frequency allows bulky audio transformers to be replaced by small inductors. Low pass LC-filtering smoothes the pulses out and restores the signal shape on the load.

SUMMARY

Example embodiments of the present disclosure provide systems and methods of reduced distortion in a class D amplifier. Briefly described, in architecture, one example embodiment of the apparatus, among others, can be implemented as follows: a signal source configured to produce a ramp signal; a first comparator configured to digitize a difference between an input signal and the ramp signal; a first integrator configured to integrate a difference between an output of the first comparator and an output of a power amplifier; a first error amplifier configured to amplify a difference between the integrated signal and the input signal; and a second comparator configured to digitize a difference between an output of the first error amplifier and the ramp signal.

Embodiments of the present disclosure can also be viewed as providing methods of reduced distortion in a class D amplifier. In this regard, one embodiment of such a method, among others, can be broadly summarized by the following: integrating an ideal amplifier output signal and a real amplifier output signal; combining the integrated signal with an input signal to produce a combined signal; and comparing the combined signal with a ramp signal.

DETAILED DESCRIPTION

Embodiments of the present disclosure will be described more fully hereinafter with reference to the accompanying drawings in which like numerals represent like elements throughout the several figures, and in which example embodiments are shown. Embodiments of the claims may, however, be embodied in many different forms and should not be construed as limited to the embodiments set forth herein. The examples set forth herein are non-limiting examples and are merely examples among other possible examples.

Class D amplifiers are often used in sound reinforcement system power amplifiers, where a high output is required. The term "Class-D" is sometimes misunderstood as meaning a "digital" amplifier. The quantization of the output signal at the power stage can be controlled by either an analog signal or a digital signal. Only in the latter case would an amplifier be using fully digital amplification.

Output stages such as those used in pulse generators are examples of class D amplifiers. However, the term mostly applies to devices intended to reproduce signals with a bandwidth well below the switching frequency. These amplifiers use pulse width modulation (PWM), pulse density modulation (sometimes referred to as pulse frequency modulation), or more advanced forms of modulation such as delta-sigma modulation or sliding mode control.

The input signal is converted to a sequence of pulses whose average value is directly proportional to the amplitude of the signal at that time. The frequency of the pulses is typically ten or more times the highest frequency of interest in the input signal. The final switching output consists of a train of pulses whose width is a function of the amplitude & frequency of the signal being amplified, and hence these amplifiers are also called PWM amplifiers. The output contains, in addition to the required amplified signal, unwanted spectral components (i.e. the pulse frequency and its harmonics) that must be removed by a passive filter. The filter is usually made with (theoretically) lossless components like inductors and capacitors in order to maintain efficiency.

A PWM amplifier operates similarly to a switching power supply (SMPS), except that a PWM amplifier is feeding a varying audio signal voltage into a relatively fixed load, while a switching power supply feeds a fixed voltage into a varying load. A switching amplifier must not be confused with an amplifier that uses an SMPS. A switching amplifier may use any type of power supply but the amplifier itself uses switching of output devices to achieve amplification.

Figure 1:
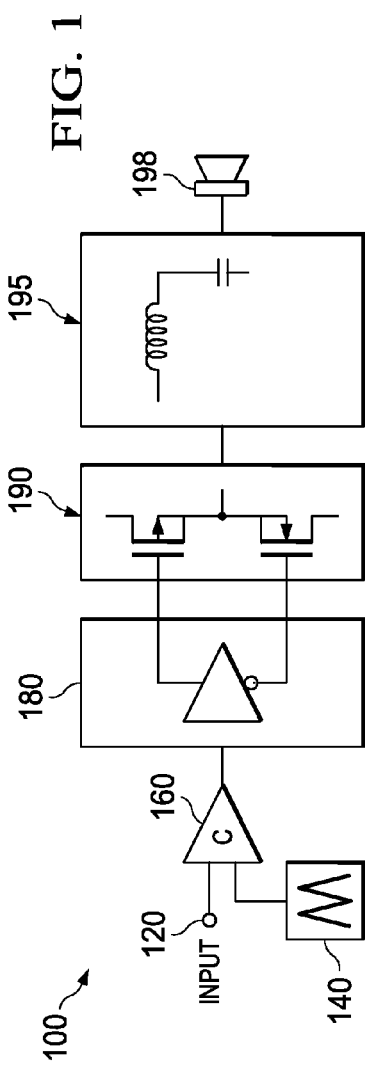
FIG. 1 is a circuit diagram of an example embodiment of a basic class D amplifier.

One way to create the PWM signal is to use comparator 160 in circuit 100 of FIG. 1. Comparator 160 compares a high frequency triangular wave generated by triangular wave generator 140 and audio input 120 and generates a series of pulses such that the width of the pulses corresponds to the amplitude and frequency of audio input 120. Comparator 160 then drives switching controller 180 which in turn drives a high-power switch 190 (comprised of MOSFETs in this non-limiting example) which generates a high-power replica of the PWM signal of comparator 160.

This PWM output is fed to low-pass filter 195 which removes the high-frequency switching components of the PWM signal to recover the audio information and feed it to loudspeaker 198. A suitably high switching frequency (or triangular waveform) is preferred in order to obtain reasonably good frequency response and low distortion. Many class-D amplifiers use switching frequencies greater than 100 kHz. These high frequencies may be implement with components in the amplifier, which are capable of high speed operation.

Another method for creating the PWM signal may be adopted when a Sony/Philips Digital Interface (SPDIF) signal or other form of digital feed is available. The digital signal may be fed to a DSP that uses software to create the PWM signal. The PWM signal is not usually fed directly to the MOSFETs but to a MOSFET driver (inside the switching controller, for example) that can deliver the high currents required to make the MOSFETs work in the non-linear area (i.e., as switches rather than amplifiers).

Design challenges for MOSFET driver circuits in class-D amplifiers may include keeping dead times and linear mode operation as short as possible. "Dead time" may be defined as the period during a switching transition when both output MOSFETs are driven into Cut-Off Mode and both are "off." Dead times should be minimized to maintain an accurate low-distortion output signal. However, dead times that are too short may cause the MOSFET that is switching on to start conducting before the MOSFET that is switching off has stopped conducting. The MOSFETs effectively short the output power supply through themselves, a condition known as "shoot-through." Meanwhile, the MOSFET drivers also need to drive the MOSFETs between switching states as quickly as possible to minimize the amount of time a MOSFET is in Linear Mode, the state between Cut-Off Mode and Saturation Mode where the MOSFET is neither fully on nor fully off and conducts current with a significant resistance, creating significant heat. Driver failures that allow shoot-through and/or too much linear mode operation may result in catastrophic failure of the MOSFETs.

The final frequency response and distortion may depend not only on the switching frequency and the output filter but also on the load (or speaker system) connected to the amplifier's output. A speaker system may contain a single driver (loudspeaker) or multiple drivers with a passive crossover. Loudspeaker impedance is not fixed and changes with audio frequency—this may compound the passive crossover's inherent problems.

This means that the load presented to the amplifier is not purely resistive and changes with the frequency of the audio signal that the amplifier outputs, thereby causing anomalies in the final frequency response (including peaking, oscillation, and distortion). Hence, class-D amplifiers may employ negative feedback to correct for phase/frequency anomalies due to speaker impedance and the crossover. This makes the design of a class-D amplifier even more complex.

Causes of distortion may include dead time band and high frequency (switching frequency) interference. Despite the complexity involved, a properly designed class-D amplifier may offer benefits such as reduction in size and weight of the amplifier; reduced power waste as heat dissipation resulting in smaller (or no) heatsinks; reduction in cost due to smaller heat sink and compact circuitry; and comparatively very high power conversion efficiency, usually greater than 90%.

The high efficiency of a class-D amplifier stems from the fact that the switching output stage is ideally not operated in the active (or linear for bipolar junction transistors) region. Instead, the output devices are either ON or OFF—both states representing minimum power dissipation in the output devices. When the output devices are ON, the current through them is maximum, but the voltage across the devices is (ideally) zero; when the devices are OFF, the voltage across the devices is maximum, but the current is zero. In both cases, the power dissipated (V×I) is zero. All these calculations are based on ideal circumstances. In practice, there are always losses due to leakage, voltage drop, switching speed of power devices, etc. However, these are still small enough to keep efficiency very high.

The output signal may still contain significant harmonic content, which may be filtered out. To maintain a high efficiency, the filtering may be performed utilizing purely reactive components (inductors and capacitors), which store the excess energy until it is needed instead of converting it into heat.

Figure 2:
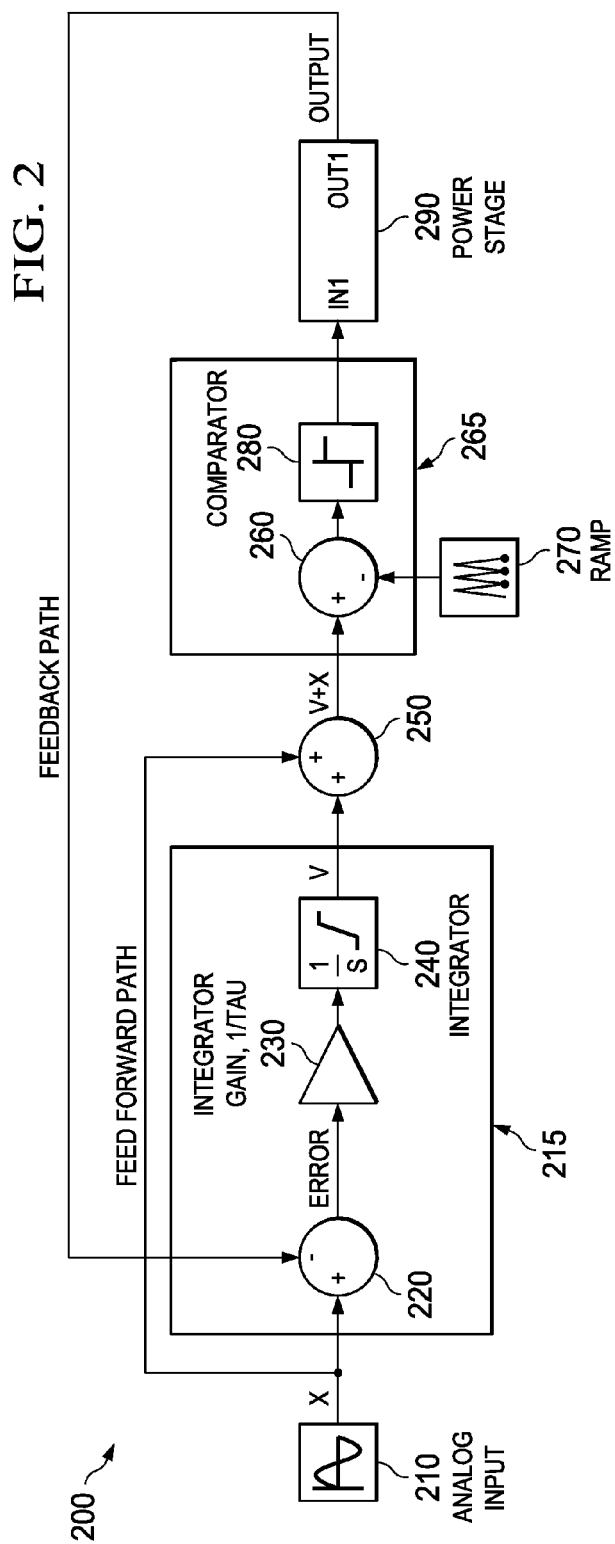
FIG. 2 is a circuit diagram of an example embodiment of the class D amplifier of FIG. 1 with feedback.

Analog input class D amplifier 200 with feedback is shown in an example embodiment in FIG. 2. Analog input 210 is applied to integrator 215 along with the feedback from the output of class D amplifier 200. Power supply noise rejection is achieved via feedback. An example embodiment of integrator 215 comprises operational amplifier 220, integrator amplifier 230, and integrator 240. The resultant output is summed with analog input 210 and compared in comparator 265. An example embodiment of comparator 265 comprises error amplifier 260, which compares the output of integrator 215 to ramp 270, shown in this non-limiting example embodiment as a dual slope signal. Alternatively, ramp 270 could be a single slope signal. The output of error amplifier 260 is then compared in this example embodiment to ground in comparator 280 and the resultant signal is amplified by power amplifier 290.

The feed forward path shown in FIG. 2 is not typical. In class D amplifiers without feed forward, the combination of error signal and analog input signal appears at the integrator output, so the input to the comparator may be very similar to that in FIG. 2.

Supply noise at a given frequency may be suppressed by roughly the loop gain at that frequency, and it may be limited by loop stability considerations. The integrator time constant can be no greater than half the ramp period. This means that loop gain at a given frequency, f, can be no greater than $f_r/\pi f$, where $f_r$ is the ramp frequency.

Figure 3:
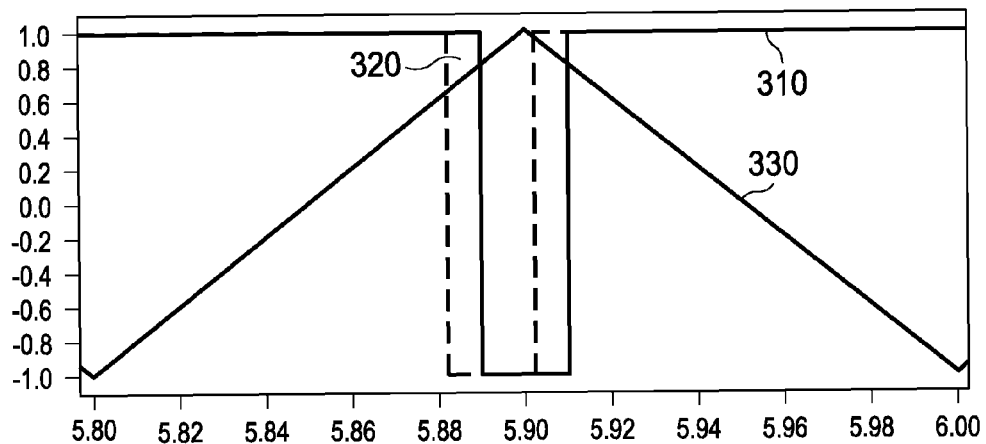
FIG. 3 is a signal diagram of an example embodiment of the class D amplifier of FIG. 2.

An undesirable side effect of feedback is that it adds harmonic distortion. The mechanism is a signal dependent time shift of the output pulse, illustrated in graph 300 in FIG. 3. Trace 330 is the ramp signal and traces 320 and 310 are the outputs of amplifiers with and without feedback, respectively. When the slope of ramp 330 and the comparator input are positive, the inverting feedback causes the integrator to slew in the negative direction, causing the comparator input to cross zero falling early. At this time the integrator begins slewing in the positive direction, causing the comparator to cross zero rising equally early. The time shift is dependent upon the magnitude of the signal and results in harmonic distortion.

Figure 4:
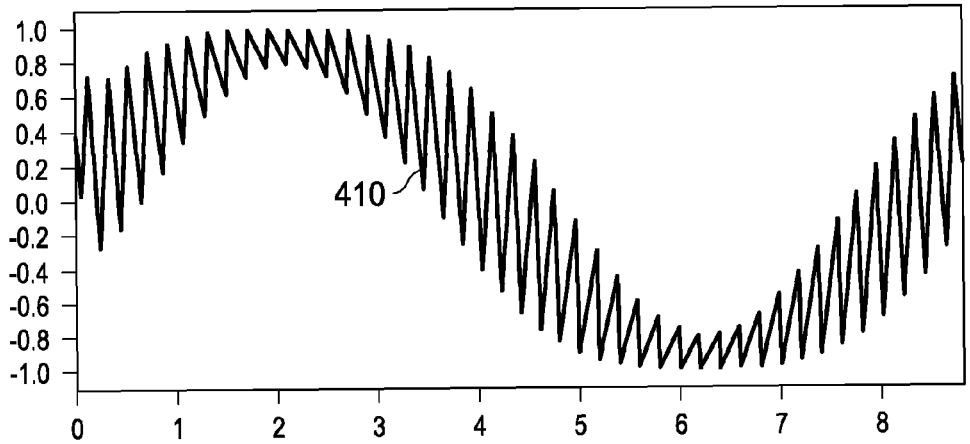
FIG. 4 is a signal diagram of an example embodiment of the class D amplifier of FIG. 2.

FIG. 4 provides graph 400 providing output signal 410 of error amplifier 250 in FIG. 2. It is, as previously described, a composite of the input signal and the integrator slewing which will be referred to henceforth as integrator "ripple." Feedback may be used to compensate the errors in the power stage: imperfect switching transients, power supply droop, etc. This is accomplished by feedback but with collateral damage, namely the integrator ripple that results in distortion. Note that even a perfect power stage will produce ripple. A desired output of the integrator is the difference between the actual ripple and "ideal ripple." This leads naturally to the idea that the integrator input may be added to an ideal replica of the output, i.e., the output of a class D amplifier without feedback.

Figure 5:
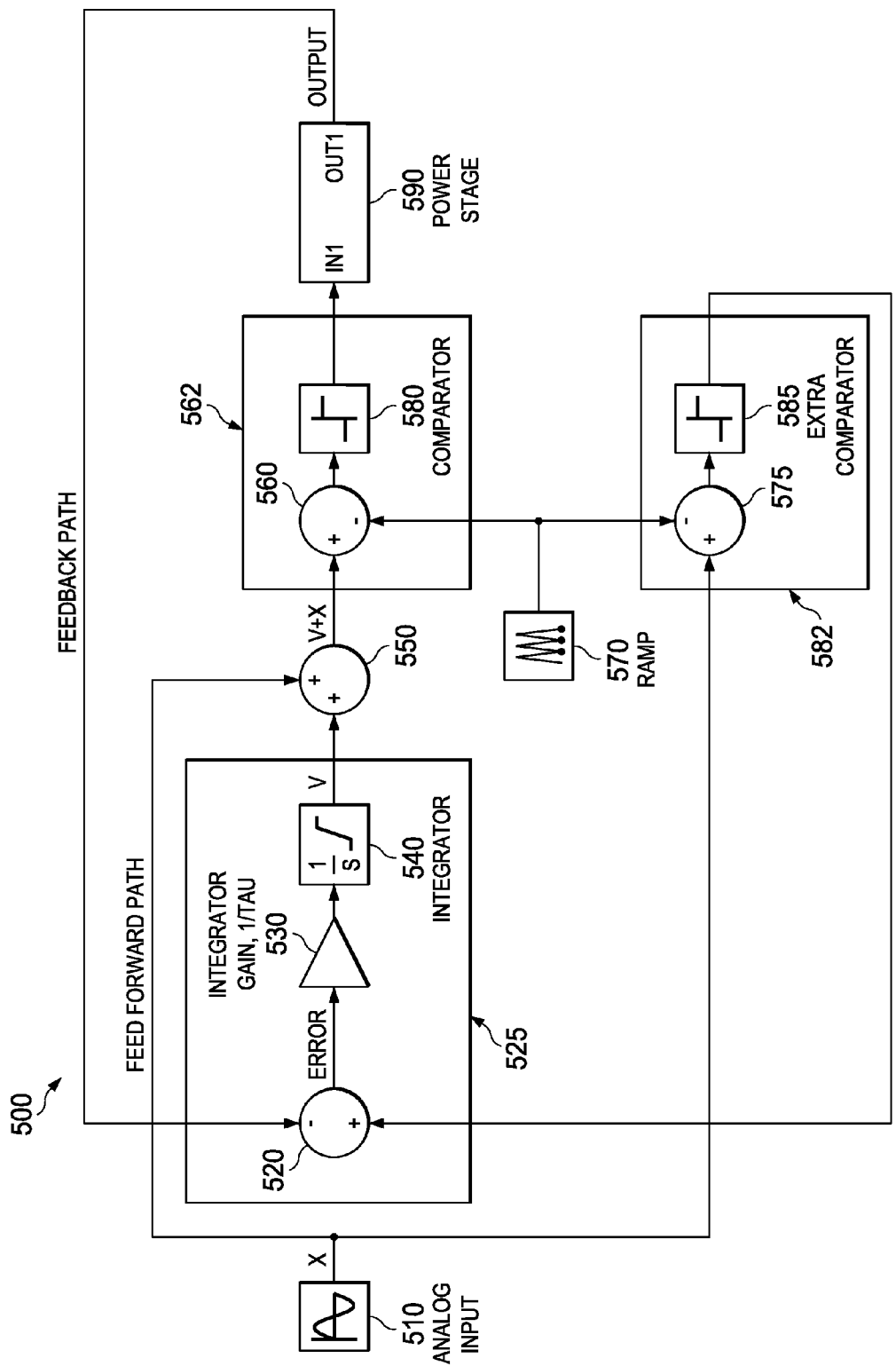
FIG. 5 is a circuit diagram of an example embodiment of a class D amplifier with an ideal output component introduced into the feedback path.

This can be accomplished with the addition of a comparator as shown in single ended class D amplifier circuit 500 in FIG. 5. Analog input 510 along with the ramp signal from ramp generator 570 is applied to comparator 582. An example embodiment of comparator 582 comprises error amplifier 575 and comparator 585. The output of error amplifier 575 is compared to ground in comparator 585 to produce an "ideal" digital output signal. The "ideal" digital output signal is then compared to the actual output signal in integrator 525. An example embodiment of integrator 525 comprises error amplifier 520 gain block 530 and integrator block 540. Now the integrator input is the difference between the output stage waveform and the ideal output stage waveform. The net input to the integrator now comprises the imperfections of the power stage, and the feedback loop drives their average to zero. This error is then amplified in integrator gain block 530 and integrated in integrator 540. The integrated signal is than applied to summer 550 where it is added to analog input 510. Then, as in the typical Class D amplifier, the integrated signal is compared to a ramp signal generated from ramp generator 570 in comparator 562. An example embodiment of comparator 562 comprises error amplifier 560 and comparator 580. The resultant signal is compared to ground in comparator 580 and applied to power stage 590.

Figure 6:
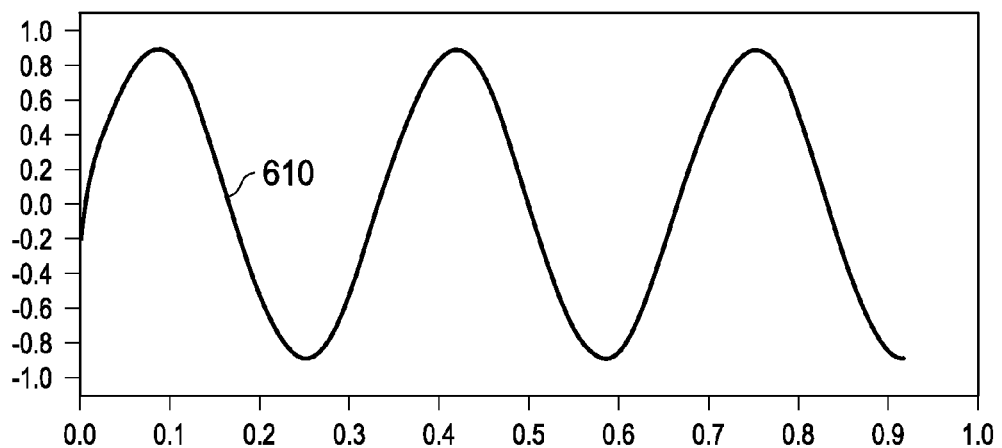
FIG. 6 is a signal diagram of an example embodiment of the class D amplifier of FIG. 5.
Figure 7:
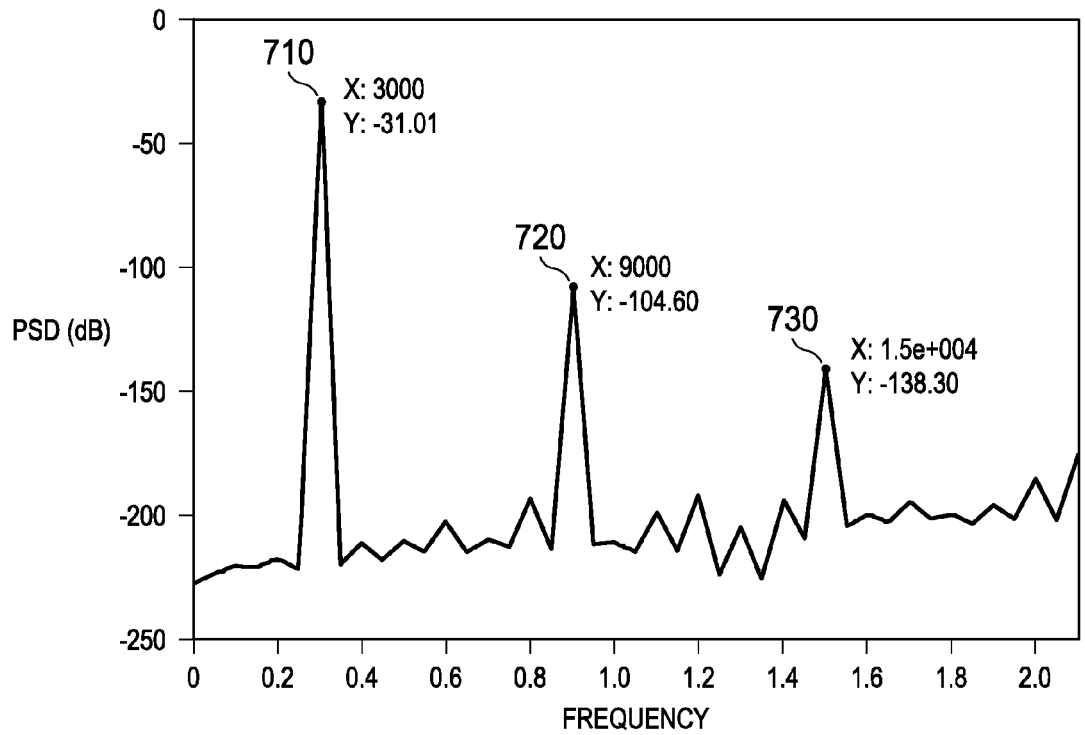
FIG. 7 is a signal diagram of an example embodiment of the class D amplifier of FIG. 5.
Figure 8:
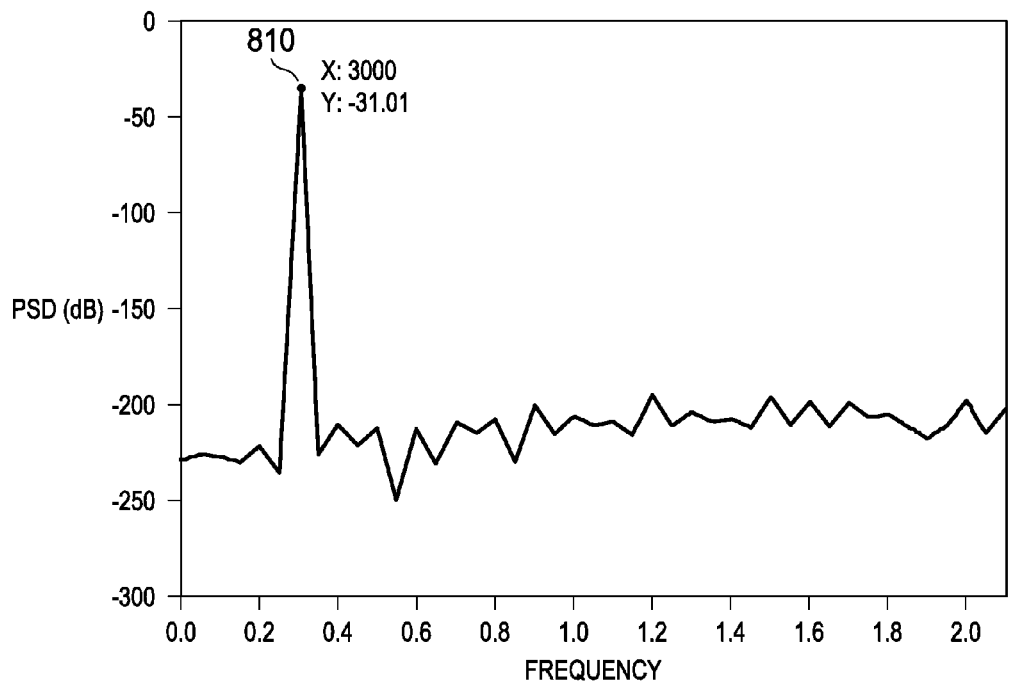
FIG. 8 is a signal diagram of an example embodiment of the class D amplifier of FIG. 5.

FIG. 6 illustrates the signal corresponding to the output of summer 550 in FIG. 5. Comparing to FIG. 4, the distortion-producing ripple is absent. This is also confirmed in the spectral analyses of the two modulators shown in FIG. 7 corresponding to the circuit of FIG. 2 and FIG. 8 corresponding to the circuit of FIG. 5. In FIG. 7, harmonics occur at 3 kHz (point 710), 9 kHz (point 720), and 15 kHz (point 730). In FIG. 8, only the 3 kHz signal (point 810) is present.

Returning again to the topic of supply rejection, recall the assertion that at frequency, f, power supply rejection can be no greater than $f_r/\pi f$, where $f_r$ is the ramp frequency. An example means to improve supply rejection is by increasing $f_r$. This constraint is specific to first order modulators. It is well known that higher order modulators provide superior supply rejection but they also produce more distortion than first order loops.

Figure 9:
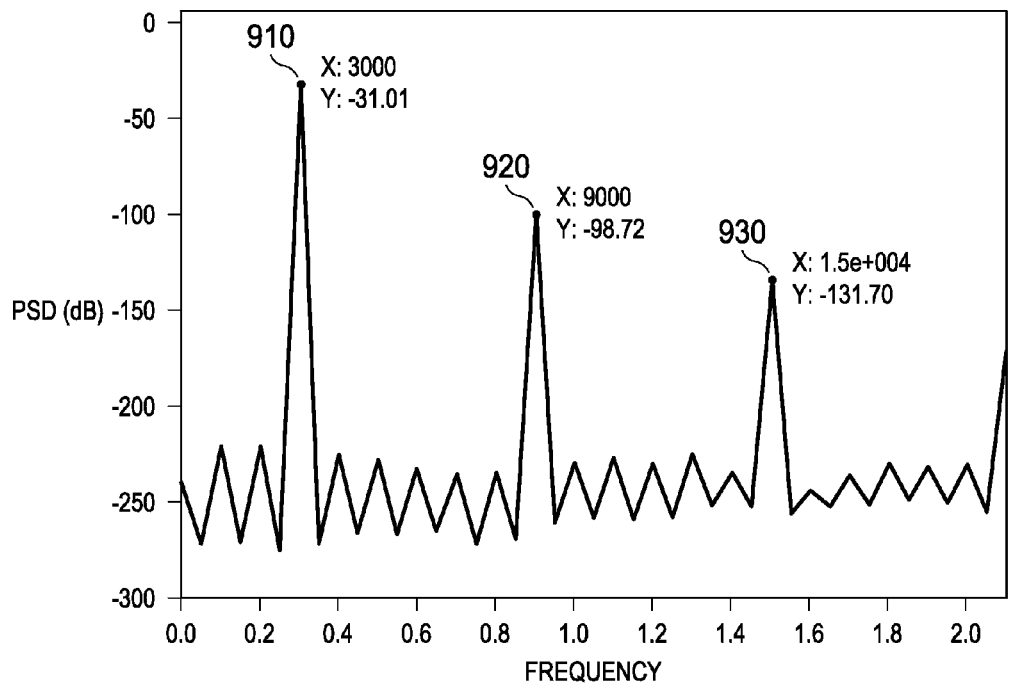
FIG. 9 is a signal diagram of an example embodiment of the class D amplifier of FIG. 5.
Figure 10:
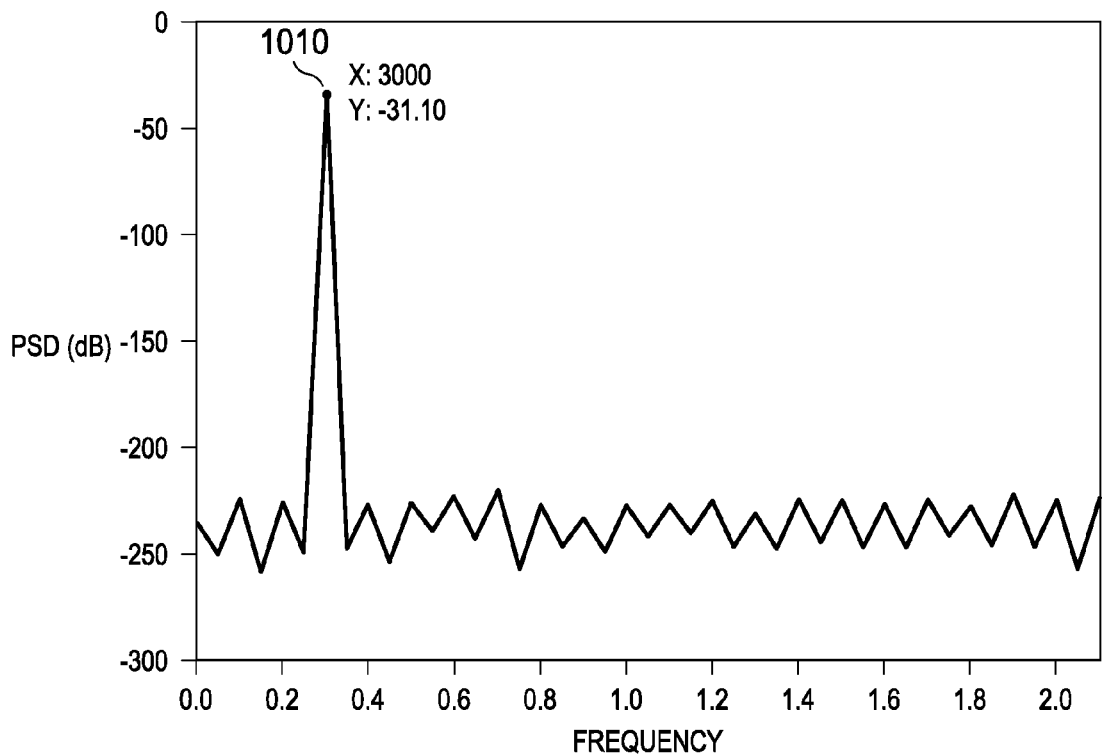
FIG. 10 is a signal diagram of an example embodiment of the class D amplifier of FIG. 5.

This is illustrated in FIG. 9 and FIG. 10, showing the spectra of a conventional second order modulator and a proposed second order modulator, respectively. In FIG. 9, harmonics occur at 3 kHz (point 910), 9 kHz (point 920), and 15 kHz (point 930). In FIG. 10, only the 3 kHz signal (point 1010) is present.

Figure 11:
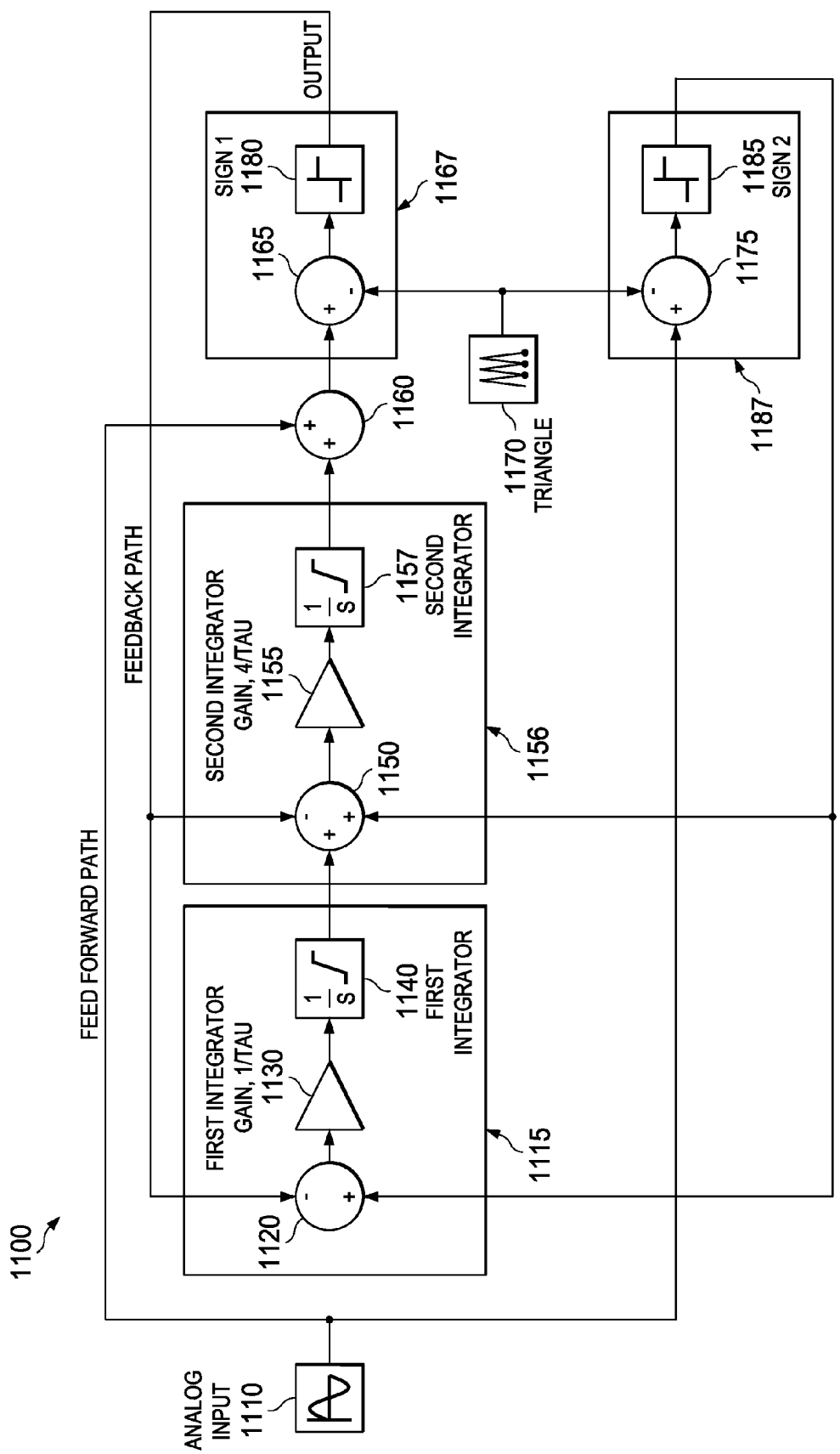
FIG. 11 is a circuit diagram of an example embodiment of the class D amplifier of FIG. 5 with a second order integrator.

A schematic of the single ended second order class D amplifier 1100 is shown in FIG. 11. In second order class D amplifier 1200, a second integrator stage is implemented and the "ideal" output signal is also added into the second integrator stage. Analog input 1110 is applied to comparator 1187 along with the ramp signal from ramp generator 1170. An example embodiment of comparator 1187 comprises error amplifier 1175 and comparator 1185. The output of error amplifier 1175 is compared to ground in comparator 1185, to produce an "ideal" digital output signal. The "ideal" digital output signal is then compared to the actual output signal in first integrator 1115. An example embodiment of first integrator 1115 comprises error amplifier 1120, first gain block 1130, and integration block 1140. Now the integrator input is the difference between the output stage waveform and the ideal output stage waveform. The net input to the integrator now comprises the imperfections of the power stage, and the feedback loop drives their average to zero. This error is then amplified in first integrator gain block 1130 and integrated in first integrator block 1140.

The integrated signal is than applied to second integrator 1156 where it is added to the "ideal" digital output signal again, and the actual output signal. An example embodiment of second integrator 1156 comprises summer 1150, second integrator gain block 1155, and second integrator block 1157. The summation signal is amplified in second integrator gain block 1155 and integrated in second integrator block 1157. The integrated signal is then summed with the analog input in summer 1160 and, as in the typical Class D amplifier, is compared to a ramp signal generated from ramp generator 1170 in comparator 1167. An example embodiment of comparator 1167 comprises error amplifier 1165 and comparator block 1180. The resultant difference signal from error amplifier 1165 is compared to ground in comparator block 1180. In an example embodiment, this resultant signal is applied to a power amplifier stage. This may be considered to be an AD amplifier.

Simulations indicate that this topology provides $f_r^2/9\pi f^2$ power supply rejection: 66.9 dB at 1 kHz and 31.2 dB at 8 kHz when the ramp frequency is 250 kHz.

Figure 12:
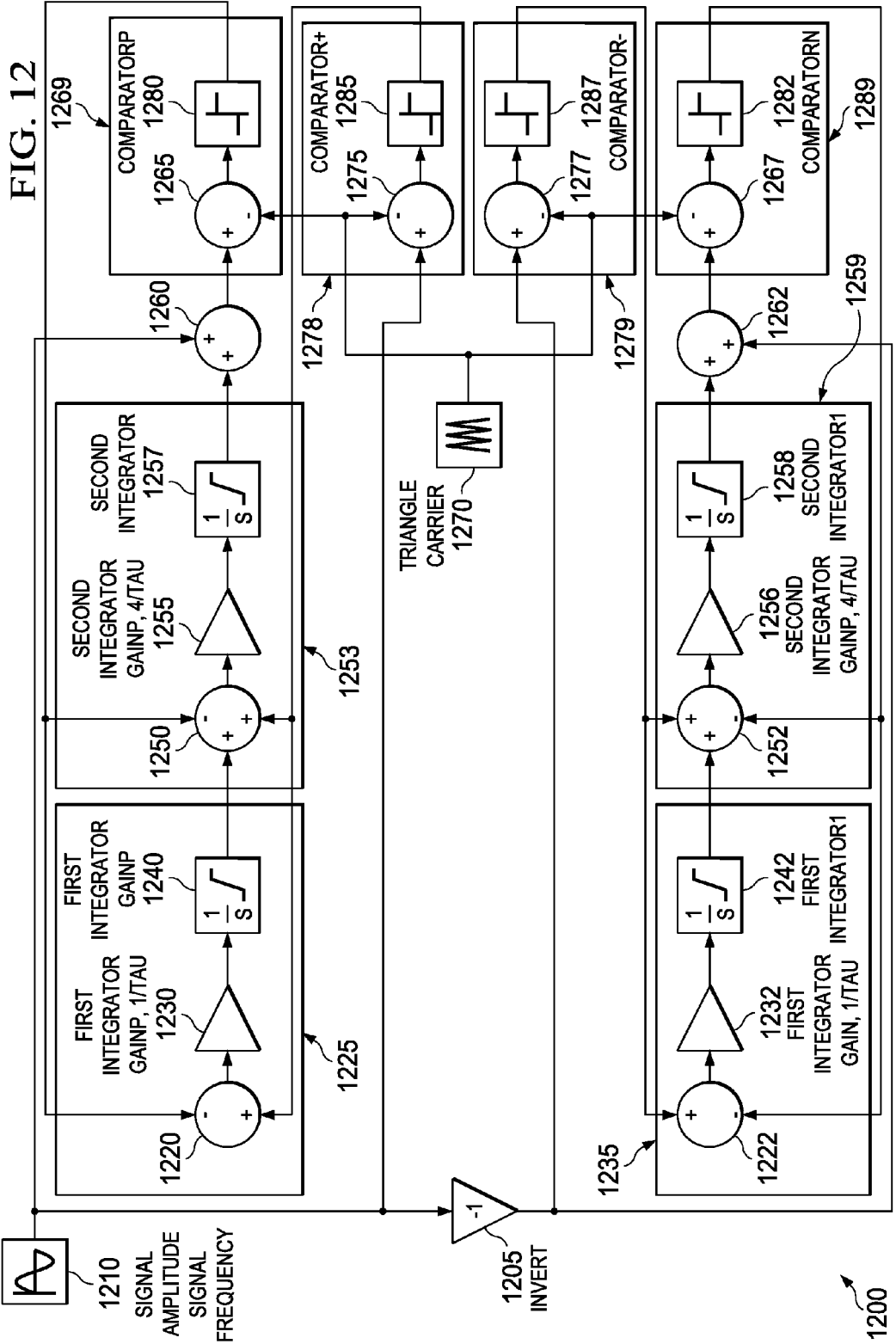
FIG. 12 is a circuit diagram of an example embodiment of the class D amplifier of FIG. 5 in a differential configuration with a second order integrator.

FIG. 12 provides a schematic of an example embodiment of a differential second order class D amplifier according to the disclosed systems and methods of reduced distortion in class D amplifiers. An example embodiment of differential circuit 1200 is made of two single ended circuits such as circuit 500 of FIG. 5 with some additional signal conditioning.

In differential second order class D amplifier 1200, both a positive and a negative side class D amplifier are combined to produce a differential output. In each side, a second integrator stage is implemented and the "ideal" output signal is also added into the second integrator stage. On the positive side, In second order class D amplifier 1200, a second integrator stage is implemented and the "ideal" output signal is also added into the second integrator stage. Analog input 1210 is applied to comparator 1278 along with the ramp signal from ramp generator 1270. An example embodiment of comparator 1278 comprises error amplifier 1275 and comparator 1285. The output of error amplifier 1275 is compared to ground in comparator 1285, to produce an "ideal" digital output signal. The "ideal" digital output signal is then compared to the actual output signal in first integrator 1225. An example embodiment of first integrator 1225 comprises error amplifier 1220, first gain block 1230, and integration block 1240. Now the integrator input is the difference between the output stage waveform and the ideal output stage waveform. The net input to the integrator now comprises the imperfections of the power stage, and the feedback loop drives their average to zero. This error is then amplified in first integrator gain block 1230 and integrated in first integrator block 1240.

The integrated signal is than applied to second integrator 1253 where it is added to the "ideal" digital output signal again, and the actual output signal. An example embodiment of second integrator 1253 comprises summer 1250, second integrator gain block 1255, and second integrator block 1257. The summation signal is amplified in second integrator gain block 1255 and integrated in second integrator block 1257. The integrated signal is then summed with the analog input in summer 1260 and, as in the typical Class D amplifier, is compared to a ramp signal generated from ramp generator 1270 in comparator 1269. An example embodiment of comparator 1269 comprises error amplifier 1265 and comparator block 1280. The resultant difference signal from error amplifier 1265 is compared to ground in comparator block 1280. In an example embodiment, this resultant signal is applied to a power amplifier stage.

On the negative side, analog input 1210 is inverted at inverter 1205 and In second order class D amplifier 1200, a second integrator stage is implemented and the "ideal" output signal is also added into the second integrator stage. Inverted analog input is applied to comparator 1279 along with the ramp signal from ramp generator 1270. An example embodiment of comparator 1279 comprises error amplifier 1277 and comparator 1287. The output of error amplifier 1277 is compared to ground in comparator 1287, to produce an "ideal" digital output signal. The "ideal" digital output signal is then compared to the actual output signal in first integrator 1235. An example embodiment of first integrator 1235 comprises error amplifier 1222, first gain block 1232, and integration block 1242. Now the integrator input is the difference between the output stage waveform and the ideal output stage waveform. The net input to the integrator now comprises the imperfections of the power stage, and the feedback loop drives their average to zero. This error is then amplified in first integrator gain block 1232 and integrated in first integrator block 1242.

The integrated signal is than applied to second integrator 1259 where it is added to the "ideal" digital output signal again, and the actual output signal. An example embodiment of second integrator 1259 comprises summer 1252, second integrator gain block 1256, and second integrator block 1258. The summation signal is amplified in second integrator gain block 1256 and integrated in second integrator block 1258. The integrated signal is then summed with the analog input in summer 1262 and, as in the typical Class D amplifier, is compared to a ramp signal generated from ramp generator 1270 in comparator 1289. An example embodiment of comparator 1289 comprises error amplifier 1267 and comparator block 1282. The resultant difference signal from error amplifier 1267 is compared to ground in comparator block 1282. In an example embodiment, this resultant signal is applied to a power amplifier stage. This may be considered to be a BD amplifier.

Figure 13:
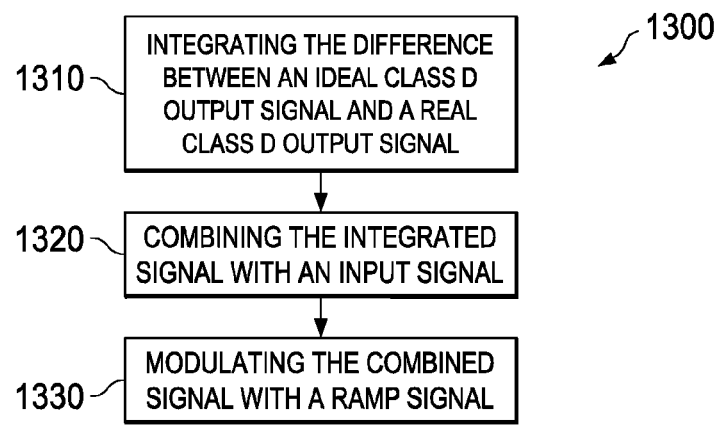
FIG. 13 is a flow chart of an example embodiment of a method of reduced distortion in a class D amplifier.

FIG. 13 provides flow chart 1300 of an example embodiment of a method of reduced distortion in a class D amplifier. In block 1310, an ideal class D amplifier output signal is integrated. In block 1320, the integrated signal is combined with an input signal. In block 1330, the combined signal is modulated with a ramp signal.

The foregoing description of the elimination of ripple from the integrator output in class D amplifiers has employed AD modulation for illustration, but there is nothing inherent in the idea to limit it to AD modulation. In fact, it seems to be applicable to all other modulation schemes employed in class D amplifiers.

The logic of the example embodiment(s) can be implemented in hardware, software, firmware, or a combination thereof. In example embodiments, the logic may be implemented in software or firmware that is stored in a memory and that is executed by a suitable instruction execution system. If implemented in hardware, as in an alternative embodiment, the logic can be implemented with any or a combination of the following technologies, which are all well known in the art: a discrete logic circuit(s) having logic gates for implementing logic functions upon data signals, an application specific integrated circuit (ASIC) having appropriate combinational logic gates, a programmable gate array(s) (PGA), a field programmable gate array (FPGA), etc. In addition, the scope of the present disclosure includes embodying the functionality of the example embodiments disclosed herein in logic embodied in hardware or software-configured mediums.

Software embodiments, which comprise an ordered listing of executable instructions for implementing logical functions, can be embodied in any computer-readable medium for use by or in connection with an instruction execution system, apparatus, or device, such as a computer-based system, processor-containing system, or other system that can fetch the instructions from the instruction execution system, apparatus, or device and execute the instructions. In the context of this document, a "computer-readable medium" can be any means that can contain, store, or communicate the program for use by or in connection with the instruction execution system, apparatus, or device. The computer readable medium can be, for example but not limited to, an electronic, magnetic, optical, electromagnetic, infrared, or semiconductor system, apparatus, or device. More specific examples (a nonexhaustive list) of the computer-readable medium would include the following: a portable computer diskette (magnetic), a random access memory (RAM) (electronic), a read-only memory (ROM) (electronic), an erasable programmable read-only memory (EPROM or Flash memory) (electronic), and a portable compact disc read-only memory (CDROM) (optical). In addition, the scope of the present disclosure includes embodying the functionality of the example embodiments of the present disclosure in logic embodied in hardware or software-configured mediums.

Therefore, at least the following is claimed:

1. An amplifier comprising:
a signal source configured to produce a ramp signal;
a first comparator configured to digitize a difference between an input signal and the ramp signal;
a first integrator configured to integrate a difference between an output of the first comparator and an output of a power amplifier;
a first error amplifier configured to amplify a difference between the integrated signal and the input signal; and
a second comparator configured to digitize a difference between an output of the first error amplifier and the ramp signal.

2. The amplifier of claim 1, wherein the input signal is an audio signal.

3. The amplifier of claim 1, wherein the first integrator comprises a gain stage.

4. The amplifier of claim 1, wherein the ramp signal is a triangular waveform.

5. The amplifier of claim 4, further comprising a second integrator stage, the second integrator stage configured to integrate the output of the first integrator stage, an output of the second comparator, and an output of the first comparator.

6. The amplifier of claim 1, further comprising an output power stage.

7. The amplifier of claim 1, wherein the amplifier is a single-ended amplifier.

8. The amplifier of claim 1, wherein the amplifier is a differential amplifier.

9. The amplifier of claim 1, further comprising:
an inverter configured to invert the input signal for a negative side of the differential amplifier;
a third comparator configured to digitize a difference between an inverted input signal and the ramp signal;
a second integrator configured to integrate a difference between an output of the third comparator and an output of the power amplifier;
a second error amplifier configured to amplify a difference between the second integrated signal and the input signal; and a fourth comparator configured to digitize a difference between an output of the second error amplifier and the ramp signal.

10. A class D amplifier comprising:
a first integrator configured to integrate an ideal output signal and a real output signal; and
a second integrator configured to integrate the ideal output signal, an output of the first integrator and the real output signal.

11. The class D amplifier of claim 10, wherein the class D amplifier is a single-ended amplifier.

12. The class D amplifier of claim 10, wherein the class D amplifier is a differential amplifier.

13. A method of amplification comprising:
integrating an ideal amplifier output signal and a real amplifier output signal;
combining the integrated signal with an input signal to produce a combined signal; and
comparing the combined signal with a ramp signal.

14. The method of claim 13, further comprising integrating a combination of an output of the first integrating step, the ideal amplifier output signal, and the real amplifier output signal.

15. The method of claim 13, wherein the amplifier is a class D amplifier.

16. The method of claim 13, wherein the amplifier is a single-ended amplifier.

17. The method of claim 16, further comprising a second integrating step for integrating a combination of an output of the first integrating step, the ideal amplifier output signal, and the real amplifier output signal.

18. The method of claim 13, wherein the amplifier is a differential amplifier.

19. The method of claim 18, further comprising a second integrating step for integrating a combination of an output of the first integrating step, the ideal amplifier output signal, and the real amplifier output signal.

* * * * *